(12) United States Patent
Pusheck et al.

(10) Patent No.: US 10,524,367 B2
(45) Date of Patent: Dec. 31, 2019

(54) SOLDERLESS SENSOR UNIT WITH SUBSTRATE CARRIER

(71) Applicant: VEONEER US INC., Southfield, MI (US)

(72) Inventors: Jacob Pusheck, West Bloomfield, MI (US); Ankur Doshi, Canton, MI (US); Joshua Forwerck, Royal Oak, MI (US)

(73) Assignee: VEONEER US INC., Southfield, MI (US)

( * ) Notice: Subject to any disclaimer, the term of this patent is extended or adjusted under 35 U.S.C. 154(b) by 0 days.

(21) Appl. No.: 15/938,796

(22) Filed: Mar. 28, 2018

(65) Prior Publication Data

US 2019/0306996 A1    Oct. 3, 2019

(51) Int. Cl.
*H05K 5/00* (2006.01)
*G01D 11/24* (2006.01)

(52) U.S. Cl.
CPC ......... *H05K 5/0026* (2013.01); *G01D 11/245* (2013.01)

(58) Field of Classification Search
CPC .... H05K 5/0026; H05K 5/0039; H05K 5/006; H05K 5/0078; H05K 5/0286; G01D 11/18; G01D 11/245
See application file for complete search history.

(56) References Cited

U.S. PATENT DOCUMENTS

| | | | |
|---|---|---|---|
| 6,053,049 A | 4/2000 | Chen et al. | 73/756 |
| 6,183,300 B1 * | 2/2001 | Belopolsky | H01R 13/7195 439/607.4 |
| 6,476,688 B2 * | 11/2002 | Palinkas | H01R 24/42 333/175 |
| 7,813,134 B2 * | 10/2010 | Katsuro | H05K 7/20454 165/104.33 |
| 8,581,116 B2 | 11/2013 | Ludwig | 174/480 |
| 8,941,018 B2 | 1/2015 | Kunert et al. | |

(Continued)

FOREIGN PATENT DOCUMENTS

| | | | | |
|---|---|---|---|---|
| DE | 102012202982 | 8/2013 | ............. | F16B 19/00 |
| DE | 102014206363 | 10/2015 | ............. | G01B 21/02 |

(Continued)

*Primary Examiner* — Hoa C Nguyen
*Assistant Examiner* — Christopher L Augustin
(74) *Attorney, Agent, or Firm* — Christopher P. Maiorana, PC

(57) ABSTRACT

An apparatus comprises a electronic assembly and a housing. The electronic assembly comprises a sensor module mounted on or encapsulated within a substrate. The housing generally has a sensor cavity configured to receive the electronic assembly, a connector cavity configured to connect with a wire harness connector, a wall separating the sensor cavity and the connector cavity, and a plurality of terminals having a first end extending from the wall into the sensor cavity and a second end extending from the wall into the connector cavity. The first end of each terminal is generally configured to form an electrical and mechanical connection with a respective conductive pad of the substrate. The wall separating the sensor cavity and the connector cavity generally comprises an overlap configured to set an amount of deflection experienced by the first end of each terminal when the electronic assembly is inserted in the sensor cavity.

20 Claims, 8 Drawing Sheets

(56) References Cited

U.S. PATENT DOCUMENTS

| | | | |
|---|---|---|---|
| 8,966,975 B2 | 3/2015 | Campbell et al. | |
| 9,107,309 B2 | 8/2015 | Kurle | |
| 9,276,351 B2 | 3/2016 | Kunert et al. | |
| 9,470,595 B2 | 10/2016 | Ramsay | |
| 9,614,299 B2 | 4/2017 | Ludwig et al. | |
| 2004/0266265 A1* | 12/2004 | Hayashi | H01R 13/5221 439/607.53 |
| 2012/0015546 A1* | 1/2012 | Yamaguchi | H01R 13/05 439/370 |
| 2012/0036930 A1 | 2/2012 | Kunert | 73/488 |
| 2012/0072047 A1* | 3/2012 | Forwerck | H01R 13/112 701/1 |
| 2012/0144914 A1 | 6/2012 | Ludwig | 73/488 |
| 2012/0247205 A1 | 10/2012 | Hortig et al. | 73/431 |
| 2013/0044437 A1 | 2/2013 | Hortig et al. | 361/728 |
| 2014/0160773 A1* | 6/2014 | Peters | F21V 23/06 362/382 |
| 2016/0197444 A1* | 7/2016 | Chen | H01R 13/665 439/620.22 |
| 2017/0176486 A1* | 6/2017 | Steinbrink | G01D 11/245 |

FOREIGN PATENT DOCUMENTS

| | | | |
|---|---|---|---|
| EP | 2036414 | 3/2009 | H05K 7/14 |
| WO | WO8805612 | 7/1988 | H01R 23/70 |

* cited by examiner

SOLDERLESS SENSOR UNIT WITH
SUBSTRATE CARRIER

FIELD OF THE INVENTION

The invention relates to sensor assemblies generally and, more particularly, to a method and/or apparatus for implementing a solderless sensor unit with a substrate carrier.

BACKGROUND

Sensors are used for many different operations within a vehicle. In an example, occupant restraint and safety systems typically need to sense relatively large/abrupt changes in acceleration and/or rotational rate over a short time period. Often, sensors are packaged with supporting electronics and typically mounted on a circuit board. The circuit board is then mounted into a housing or directly to a vehicle structure.

It would be desirable to implement a solderless sensor unit with a substrate carrier.

SUMMARY

The invention concerns an apparatus comprising a electronic assembly and a housing. The electronic assembly generally comprises a sensor module mounted on or encapsulated within a substrate comprising a plurality of exposed conductive pads. The housing generally has a sensor cavity configured to receive the electronic assembly, a connector cavity configured to connect with a wire harness connector, a wall separating the sensor cavity and the connector cavity, and a plurality of terminals having a first end extending from the wall into the sensor cavity and a second end extending from the wall into the connector cavity. The first end of each terminal is generally configured to form an electrical and mechanical connection with a respective conductive pad of the substrate. The wall separating the sensor cavity and the connector cavity generally comprises an overlap configured to set an amount of deflection experienced by the first end of each terminal when the electronic assembly is inserted in the sensor cavity.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 2:
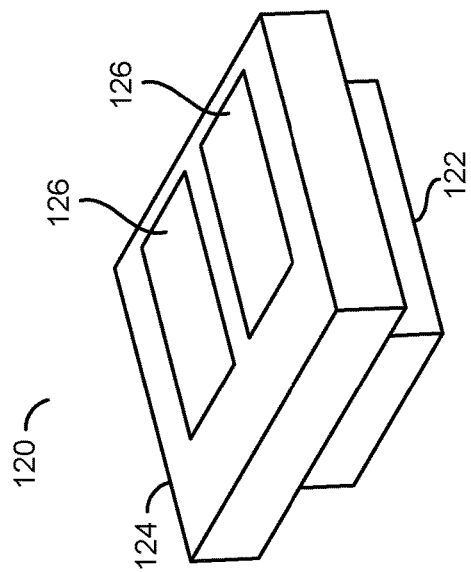
FIG. 2 is a diagram illustrating a electronic assembly in accordance with an example embodiment of the invention.

Embodiments of the present invention include providing a solderless sensor unit with substrate carrier that may (i) utilize pin geometries to reduce stress, (ii) provide housing guide features to facilitate sensor package orientation and position, (iii) include terminal shelf features to reduce pin stress, (iv) reduce cost, (v) allow smaller package size, (vi) provide flexibility in design, (vii) allow for rotation of a sense direction of a sensor, (viii) allow for adding discrete components, and/or (ix) provide interchangeability.

Current objectives in remote sensor unit (RSU) design include reduction of cost, reduction of variants, reduction of size, and decreased manufacturing cycle time. In various embodiments, the invention provides solutions that address the above objectives. In various embodiments, cost of the overall device may be reduced by utilizing a printed circuit board (PCB) or a simple substrate (SUB) mounted sensing unit. The PCB (or SUB) generally achieves a more generalized manufacturing scheme by allowing for multiple sensor manufacturers to produce products that may be used in the same mechanical housing. In various embodiments, the invention also facilitates a smaller overall package size. In various embodiments, some soldering operations (or press fit pins) may be avoided (or eliminated) to reduce cost and manufacturing complexity. In various embodiments, a design is provided that also allows for the sensor component to be rotated on the substrate such that a sense direction of the electronic assembly may be changed without any change to the sensor component (element).

In various embodiment, electrical and mechanical connections to the electronic assembly are formed by deflected terminal pins pressing against contact pads of the substrate of the electronic assembly. Stress from the deflecting terminal pins is generally dissipated through the substrate rather than being applied to the actual sensor element (e.g., micro electromechanical system/sensor (MEMS), etc.) itself. Preventing the stress from being applied to the sensor element generally prevents the stress from corrupting the signal accuracy of the sensor element. In various embodiments, a discrete component or components may be added to the substrate when needed (e.g., to increase performance characteristics). In various embodiments, a housing is provided that includes a receiving portion configured to guide the substrate into a desired (final) position. Terminal pins in the housing are generally configured to apply a compressive (normal) force to exposed contact pads on (or in) a surface of the substrate to hold the substrate in place over a lifetime of the sensor unit. The terminal pins also provide the electrical connections for powering and/or communicating with the sensor element.

The substrate and sensor package (or module or chip or element) are generally implemented as a single integrated package (SIP). The SIP generally provides exposed contact pads to be contacted by the terminals (pins) in the sensor housing. In various embodiments, the sensor package may be mounted to the substrate and connected to the exposed pads by soldering or welding. In an example, the sensor package may be locally soldered (e.g., using solder paste in a re-flow oven). In another example, the sensor package may be welded (e.g., laser, contact, etc.). The contact between the sensor package and the exposed pads may be implemented via traces (e.g., copper trails) on the substrate. The pins generally include features that allow the pins to maintain contact with the exposed pads of the SIP. In some embodiments, the exposed pads may be dimpled at the contact surface. Dimpled contact pads may increase the ability of the pins to hold the SIP in the desired position within the sensor housing. In various embodiments, the contact surface between the exposed pads and the pins may be rectangular, oval, or circular in nature. However, other contact geometries may be implemented to meet the design criteria of a particular implementation. The housing generally provides features to maintain an arrangement of the pins and to receive the electronic assembly. The electronic assembly generally provides strain relief and interchangeability, as well as flexibility in design to allow for rotation of the sensor element and/or addition of one or more discrete components.

The electronic assembly may include a sensor housing and terminals that are configured to interface with a sensor module (or assembly or package). The terminals may be stitched or molded into the sensor housing. The sensor module may include a sensor package (or element) and a substrate carrier that may provide improved manufacturability and durability of the assembly. The terminals may be configured to provide a spring force against electrical contact pads of the substrate of the electronic assembly. The spring force may be configured to mechanically support the electronic assembly. The spring force may also create an electrical connection between the electronic assembly and the terminals. The substrate generally dissipates the stress of the spring force before the stress reaches the sensor package.

Figure 1:
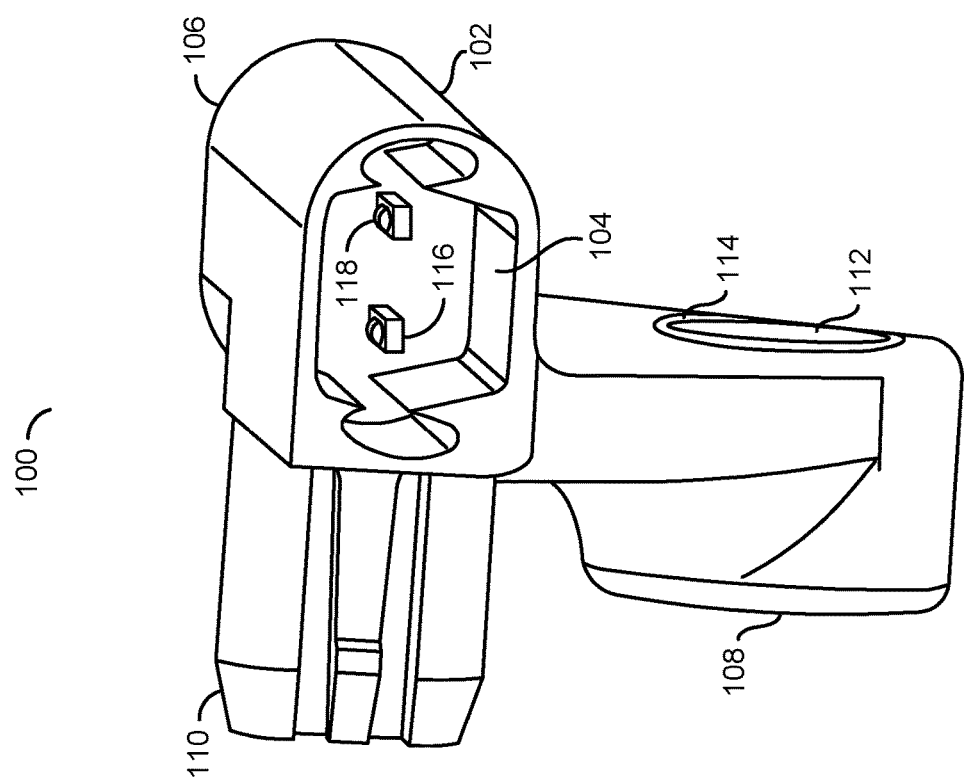
FIG. 1 is a diagram illustrating a remote sensor assembly housing in accordance with an example embodiment of the invention.

Referring to FIG. 1, a diagram is shown illustrating a remote sensor assembly 100 in accordance with an example embodiment of the invention. The remote sensor assembly (or apparatus, or device, or module, or unit) 100 generally implements a kinematic sensor suitable for use in automotive applications. In an example, the remote sensor assembly 100 may be used to implement a remote (or satellite) sensor unit (RSU). In an example, the RSU may be part of a restraint control system of a vehicle. The remote sensor assembly 100 generally comprises a housing assembly 102 and a electronic assembly 120 (described below in connection with FIGS. 2 and 3).

In an example, the housing assembly 102 may comprise a first (sensor) cavity 104, a second (connector) cavity 106, a mounting boss 108, and a locating (or anti-rotation) tab 110. The first cavity 104 and the second cavity 106 are generally separated by a wall. The mounting boss 108 generally includes a mounting bore 112. The mounting bore 112 is generally configured to receive a bolt for mounting the remote sensor assembly 100 to a structure (e.g., a frame, a pillar, or a panel of a vehicle, etc.). In some embodiments, a bushing 114 may be disposed within the mounting bore 112. The bushing 114 may be configured to isolate the sensor module from the mounting structure. The bushing 114 may be a metal bushing. The housing assembly 102 generally includes a number of terminals 116. In an example, the terminals 116 may be stitched through the wall separating the first cavity 104 from the second cavity 106. In another example, the terminals 116 may be molded in the wall of the housing assembly 102.

In an example, each of the terminals 116 may include a contact surface (or bead) 118. The contact beads 118 may be configured to make electrical and mechanical connections with exposed electrical contact pads of the electronic assembly 120. In various embodiments, a contact surface between the exposed pads and the contact beads 118 of the pins 116 may be rectangular, oval, or circular in nature. However, other contact surface geometries may be implemented to meet the design criteria of a particular implementation. In various embodiments, the pins 116 may be configured to deflect when the electronic assembly 120 is inserted into the sensor cavity 104, applying a normal (perpendicular) spring (compression) force to the exposed contact pads of the electronic assembly 120.

In an example, the housing assembly 102 may be formed of a plastic material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of these resins. The housing assembly 102 may be formed using various techniques including, but not limited to casting, injection-molding, and three-dimensional printing. In an example, the housing may be molded in a single step without other components. In another example, the housing may be molded in a single step with the pins 116 in a predefined position. The housing assembly 102 may have a generally elongated shape. The first (sensor) cavity 104 may be configured to receive the electronic assembly 120. The second (connector) cavity 106 may be configured to receive an electrical connector (e.g., for connecting the sensor module to a vehicle system or bus).

The first (sensor) cavity 104 is generally disposed at a first end of the housing assembly 102. The first (sensor) cavity 104 may be accessible through a sensor receiving opening in an end surface of the housing assembly 102. The first (sensor) cavity 104 and the sensor receiving opening are generally shaped to receive and guide insertion of the electronic assembly 120. The second (connector) cavity 106 may be formed at a second end of the housing assembly 102, opposite from the first end. The second (connector) cavity 106 is generally accessible through an opening in the second end of the housing assembly 102. The second (connector) cavity 106 is generally shaped to receive an electrical socket (or plug) configured to make electrical connection(s) with the pins (or terminals) 116, which connect to the electronic assembly 120 in the first (sensor) cavity 104 and extend through the wall into the second (connector) cavity 106.

The locating (or anti-rotation) tab 110 may be disposed along another side of the first cavity 104 and/or the second cavity 106. The mounting boss 108 and the locating tab 110 are generally configured to facilitate locating the remote sensor assembly 100 to a vehicle structure (e.g., A-pillar, B-pillar, door panel, body panel, etc.). The locating tab 110 may include resilient tabs (barbs) providing a snap fit into a corresponding receiving hole of the vehicle structure to which the remote sensor assembly 100 is mounted. Additional locating tabs may be implemented accordingly to meet design criteria of a particular application. In various embodiments, a center axis of the mounting bore 112 may be aligned parallel to the locating tab 110. In an example, the mounting boss 108 may be askew of (or offset from) a centerline of the portion of the housing assembly 102 containing the first cavity 104 and the second cavity 106. Other arrangements of the mounting boss 108 and the location feature 110 may be implemented to meet the design criteria of a particular application.

Referring to FIG. 2, a diagram is shown illustrating a electronic assembly in accordance with an example embodiment of the invention. In various embodiments, the electronic assembly 120 generally comprises a sensing/sensor unit (or module or chip) 122 mounted on (or in) a substrate/PCB 124. The electronic assembly 120 may be implemented as a kinematic sensor. In an example, the electronic assembly may include only the sensing chip 122 attached to or enclosed in the substrate (or protective layer) 124. In an example, the electronic assembly 120 may be locally soldered (e.g., using solder paste in a re-flow oven). In another example, the sensor package may be welded (e.g., laser, contact, etc.). In various embodiments, the sensing/sensor unit (or module or chip) 122 may include, but is not limited to a micro electro-mechanical system/sensor (MEMS), an accelerometer, a pressure sensor, and/or a temperature sensor. In an example, the accelerometer sensor package may be used as part of a restraint control system for deploying safety components, such as air bags, active restraints, or similar vehicular systems.

The protective layer (or substrate) 124 generally includes connection (or contact) pads 126 exposed in (or on) a surface of the substrate layer 124. In an example, the sensing unit 122 and the exposed pads 126 may be connected via traces (e.g., copper trails) on or vias through the substrate/PCB 124. The connection pads 126 are generally configured for electrically and mechanically connecting the electronic assembly 120 with the pins 116. The electronic assembly 120 may be configured for solderless physical and electrical connection with the terminals 116. In an example, a first terminal pin 116 may be in electrical connection with a first pad 126 on the surface of the substrate/PCB 124 to provide power to the sensing module 122. In another example, a second terminal pin 116 may be in electrical connection with a second pad 126 on the surface of the substrate/PCB 124 to provide an accelerometer signal from the sensing module 122. In yet another example, a first terminal pin 116 may be in electrical connection with a first pad 126 on the surface of the substrate/PCB 124 to provide power to the sensing module 122 and a second terminal 116 may be in electrical connection with a second pad 126 on the surface of the substrate/PCB 124 to provide a circuit ground potential to the sensing module 122 and a signal (e.g., an accelerometer signal) from the sensing module 122 may be modulated on the electrical connection with the first pad 126.

In an example, the substrate/PCB 124 includes features for guiding the electronic assembly 120 into the first (sensor) cavity 104 of the sensor housing 102. The contact pads 126 are generally exposed on or through a surface of the substrate portion 124 of the electronic assembly 120. In an example, the contact pads 126 may be flush with the surface of the substrate/PCB 124. In an example, the contact pads 126 may be positioned such that when the electronic assembly 120 is fully inserted into the sensor housing 102, the contact pads 126 are aligned with the contact beads 118 on the corresponding terminals 116 within the sensor housing 102. In an example, the sensing chip 122 may be mounted on or attached to a side of the substrate/PCB 124 that is opposite of the side of the substrate/PCB 124 on which the contact pads 126 are exposed.

Figure 3:
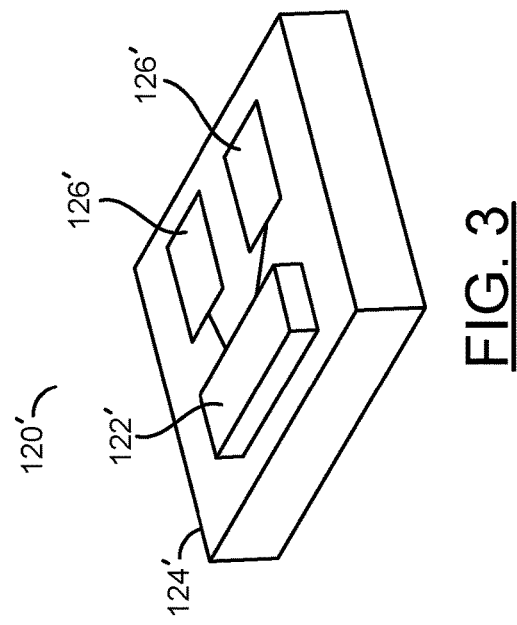
FIG. 3 is a diagram illustrating a electronic assembly in accordance with another example embodiment of the invention.

Referring to FIG. 3, a diagram is shown illustrating a electronic assembly 120' in accordance with another example embodiment of the invention. In various embodiments, the electronic assembly 120' generally comprises a sensing unit (or module or chip) 122' mounted on (or in) a substrate/PCB 124'. The electronic assembly 120' may be implemented as a kinematic sensor. In an example, the electronic assembly 120' may include only the sensing chip 122' attached to or enclosed in the protective (or substrate) layer 124'. In various embodiments, the sensing unit (or module or chip) 122' may include, but is not limited to a micro electro-mechanical system/sensor (MEMS), an accelerometer, a pressure sensor, and/or a temperature sensor. In an example, the accelerometer sensor package may be used as part of a restraint control system for deploying safety components, such as air bags, active restraints, or similar vehicular systems. The protective layer (or substrate) 124' generally includes connection (or contact) pads 126' exposed in (or on) the surface of the substrate layer 124' on which the sensing chip 122' is attached or mounted. The connection pads 126' are generally configured for electrically and mechanically connecting with the electronic assembly 120'. The electronic assembly 120' may be configured for solderless physical and electrical connection with the terminals 116.

Figure 4:
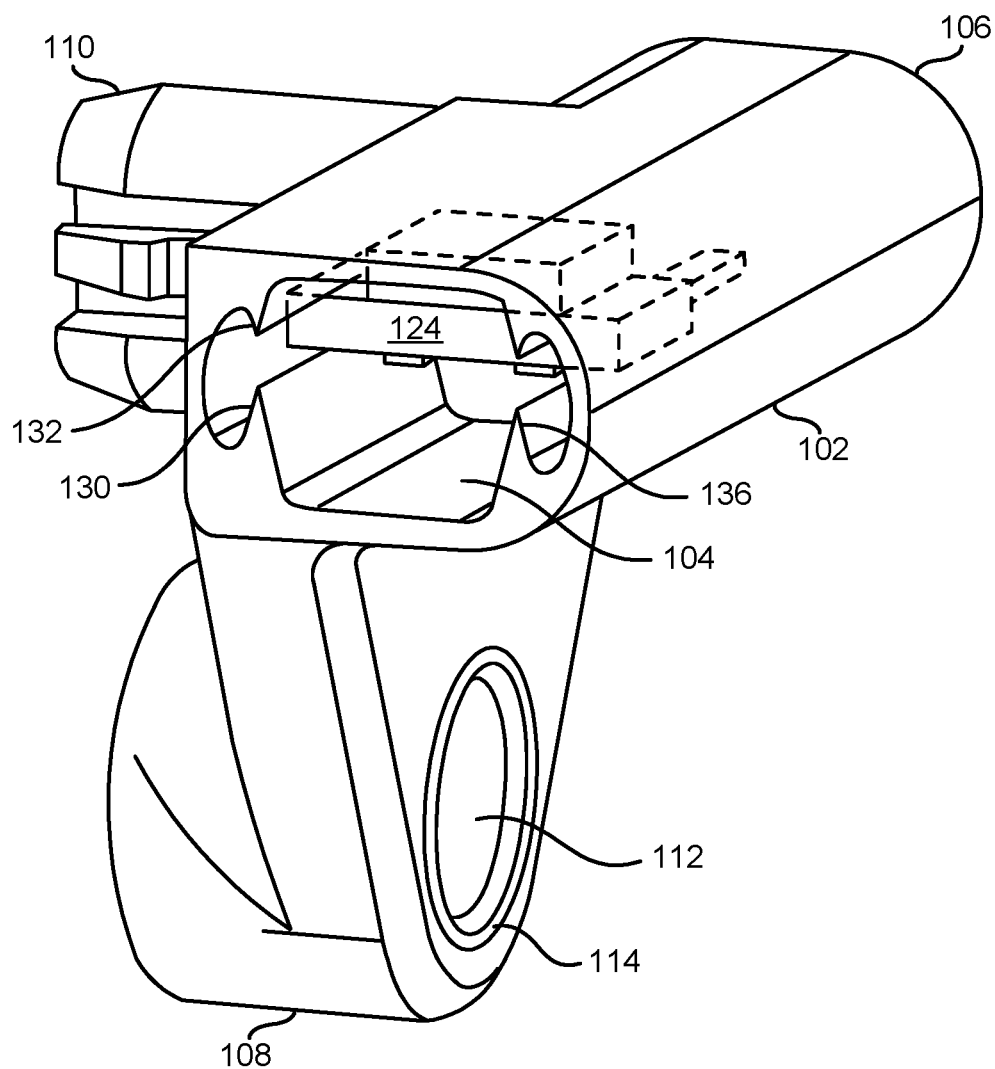
FIG. 4 is a diagram illustrating a sensor assembly in accordance with an example embodiment of the invention.

Referring to FIG. 4, a diagram is shown illustrating the electronic assembly 120 inserted into the housing 102 in accordance with an example embodiment of the invention. In various embodiments, the sensor housing 102 may include features that are generally configured (e.g., shaped) to receive and guide insertion of the electronic assembly 120 (or the electronic assembly 120'). In an example, the first (sensor) cavity 104 may include features 130-136 that may be configured to allow the electronic assembly 120 (or 120') to be slid into the first cavity 104. The features 130-136 may be further configured to locate the electronic assembly 120 (or 120') relative to the terminals 116. In an example, the features 130-136 may implement flexible (or crushable) ribs configured to contact opposite surfaces of the substrate/PCB 124 (or 124'). The features 130-136 may be configured to align and hold the electronic assembly 120 (or 120') in position against the terminal pins 116 within the first (sensor) cavity 104. In an example, the features 130-136 may be configured to have an edge that runs from the sensor receiving opening of the first cavity 104 to the wall between the first and second cavities 104 and 106. The features 130-136 are generally configured to allow the substrate/PCB 124 (or 124') to slide between pairs of the features. In an example, one side of the substrate/PCB 124 (or 124') slides between a first pair of the features (e.g., features 130 and 132) and an opposite side of the substrate/PCB 124 (or 124') slides between a second pair of the features (e.g., features 134 and 136).

Figure 5:
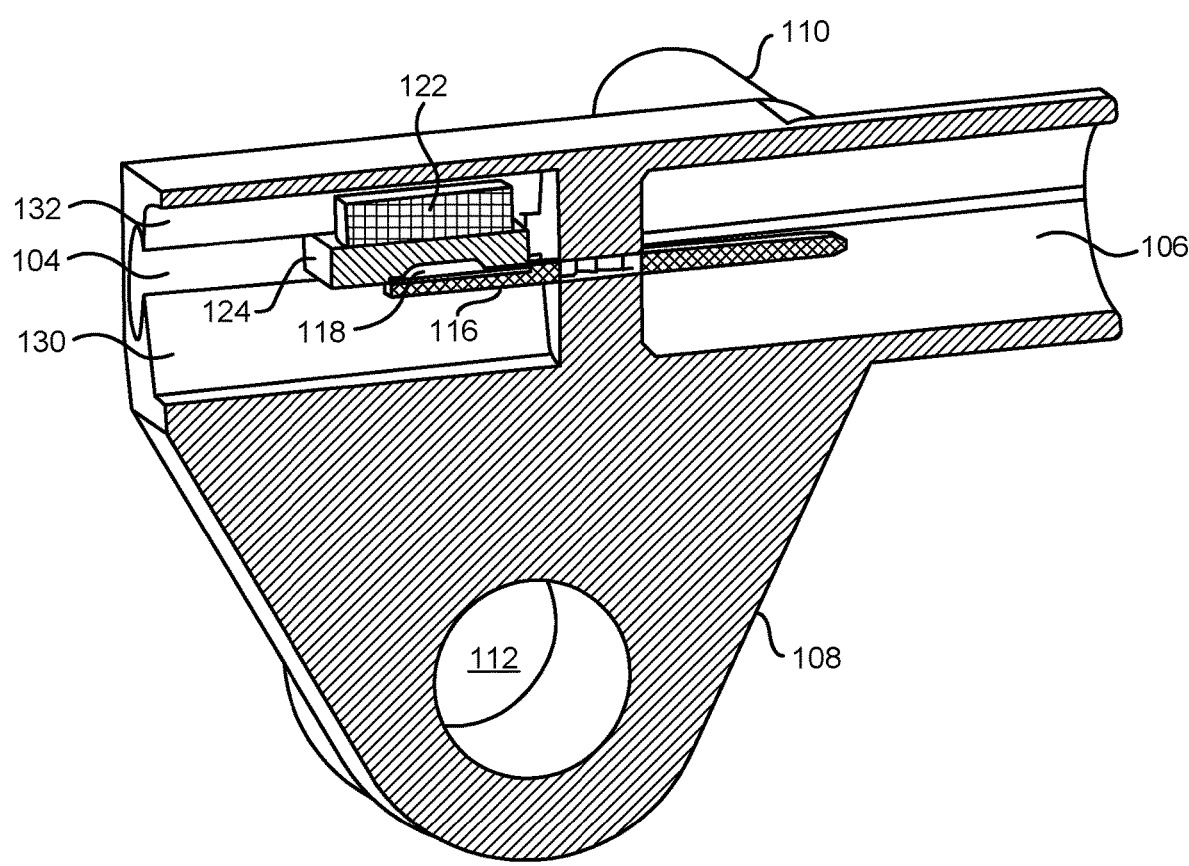
FIG. 5 is a diagram illustrating a cross-sectional view of the sensor assembly of FIG. 4.

Referring to FIG. 5, a diagram is shown illustrating the electronic assembly 120 in contact with a terminal pin inside the sensor housing 102 in accordance with an example embodiment of the invention. In an example, the sensor housing 102 includes a first opening that forms the first cavity 104 and a second opening that forms the second cavity 106. The terminal pin 116 generally extends from a wall between the cavities 104 and 106 into both the first cavity 104 and the second cavity 106. In various embodiments, a first (sensor contact) end of the pin 116 extends from the wall into the first (sensor) cavity 104 and a second (connector) end of the pin 116 extends from the wall into the second (connector) cavity 106.

The first cavity 104 may be configured to receive the electronic assembly 120 in such a way that the terminal 116 is deflected away from a surface of the electronic assembly 120 as the electronic assembly 120 is inserted toward the wall between the first cavity 104 and the second cavity 106. The contact bead 118 generally increases the amount of deflection and provides a smaller contact area than the terminal pin 116 alone. The increased deflection and the reduced contact area generally increases a compression (or normal) force applied by the deflected pin 116 to the substrate/PCB 124. The substrate/PCB 124 generally isolates the sensing unit 122 from the stress of the normal force applied by the pins 116.

The second cavity 106 may be configured to receive a mating connector, for example, from a wiring harness of a vehicle to electrically connect the remote sensor assembly 100 to a controller (e.g., ECU, etc.) of the vehicle. The second end (connector portion) of the terminals 116 may extend into the second cavity 106 and be configured to provide electrical connection to mating terminals within the mating connector. The contact bead 118 of the terminals 116 may provide a spring force against the substrate/PCB 124 of the electronic assembly 120. The spring force may provide a continuous and firm physical contact between the terminals 116 and electrical contact pads on a surface of the electronic assembly 120. The spring force may also provide a firm contact between the electronic assembly 120 and the sensor housing 102. The spring force may be configured to be large enough to hold the electronic assembly 120 in position within the housing 102 during impacts to the vehicle.

Figure 6:
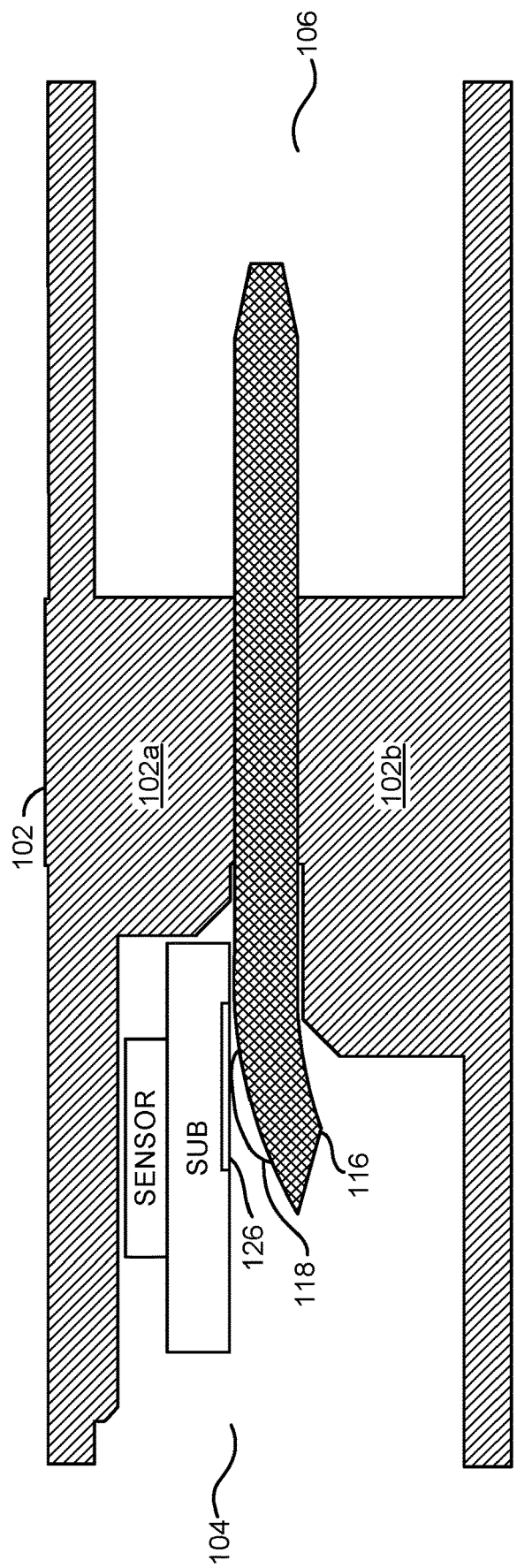
FIG. 6 is a diagram illustrating an example terminal deflection in accordance with an embodiment of the invention.

Referring to FIG. 6, a diagram is shown illustrating an example terminal deflection in accordance with an embodiment of the invention. The wall of the sensor housing 102 between the first cavity 104 and the second cavity 106 is generally thicker on one side of the terminal 116 than on the other side of the terminal 116. In an example, a portion 102a of the wall that is on a electronic assembly side of the pin 116 may have a first thickness and a portion 102b of the wall on the opposite side of the pin 116 may have a second thickness that is larger than the first thickness. The difference in thickness between the first portion 102a and the second portion 102b is generally realized as an extension of the wall portion 102b on the first cavity side. The extension of the wall portion 102b into the first cavity 104 generally acts as a fulcrum about which the pin 116 may deflect. A distance between a first end of the terminal 116 in the first cavity 104 and the wall portion 102a, on the electronic assembly side of the terminal 116, is generally configured to place the contact bead 118 on the contact pad 126 when the electronic assembly 120 is fully inserted. The thickness of the wall portion 102b, on the opposite side of the terminal 116 from the electronic assembly 120, generally determines a magnitude of a spring force provided by the terminal 116 when the electronic assembly 120 is fully inserted. The contact bead 118 generally provides added support for improving an electrical transfer function and a mechanical transfer function of the connections between the substrate/PCB 124 of the electronic assembly 120 and the terminals (or pins) 116. In an example, an edge of the wall portions 102a and 120b may include a chamfer as a general aide to assembly.

Figure 7:
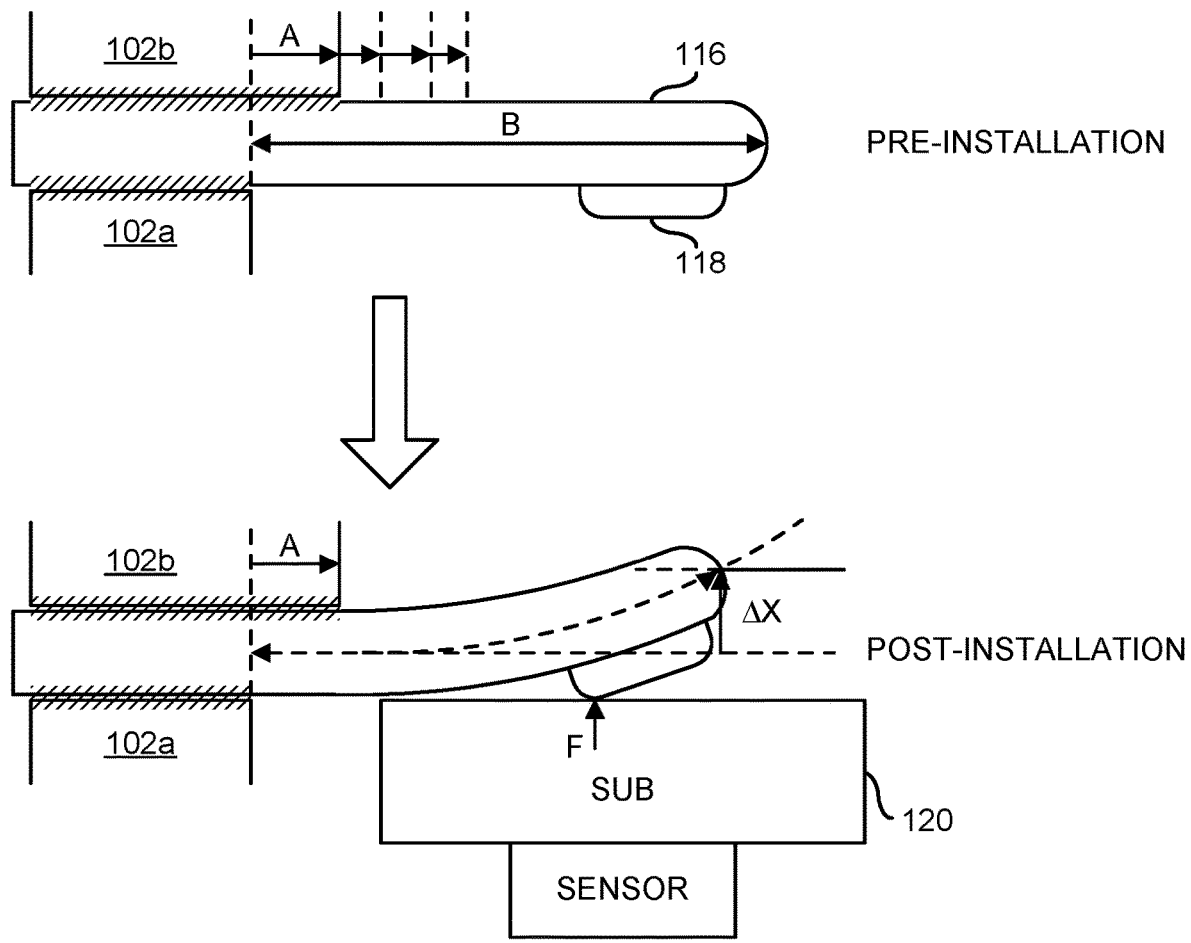
FIG. 7 is a diagram illustrating parameters determinative of terminal deflection.

Referring to FIG. 7, a diagram is shown illustrating parameters determinative of terminal deflection. A newton (N) is the international unit of measure for force. One newton is equal to 1 kilogram meter per second squared.

$$1\,N = 1\,kg \cdot \frac{m}{s^2} \qquad \text{EQ. 1}$$

In other words, 1 newton of force is the force required to accelerate an object with a mass of 1 kilogram 1 meter per second per second. In various embodiments, when the terminals 116 are deflected, the terminals 116 apply a compressive (or normal) force (F) to the substrate/PCB 124 of the electronic assembly 120. Since the compressive force F applied by the terminal 116 is to hold the electronic assembly 120 in place, the force F should be configured to match the force needed to hold the electronic assembly 120 in place for the highest acceleration expected to be experienced by the electronic assembly 120 (e.g., due to an impact).

In general, force (F) needed to hold the electronic assembly 120 in place for the highest acceleration expected due to an impact is equal to the product of mass (m) and acceleration (a):

$$F = ma, \qquad \text{EQ. 2}$$

where "m" represents the mass of the electronic assembly 120 and "a" represents the highest acceleration signal seen or expected in a vehicle impact. In an example, the electronic assembly 120 may have a mass of about 0.274 grams and the highest acceleration may be 29,430 m/s². Applying Equations 1 and 2:

$$F = \left(\frac{0.274\ \text{grams}}{1000}\right) \cdot 29{,}430 \frac{m}{s^2}$$

$$F = 8.05\ N.$$

However, the actual force holding the electronic assembly 120 in place is the friction force between the electronic assembly 120 and the pins 116. The friction force is generally equal to the normal force N applied to the surface of the electronic assembly 120 divided by the coefficient of friction (CoF) of the sensor assembly 102:

$$F = \frac{N}{CoF}. \qquad \text{EQ. 3}$$

Taking the force to hold the electronic assembly in place, calculated above, as the normal force "N", and dividing by the static coefficient of friction for the electronic assembly 120 (e.g., 0.83), yields a force of 9.66 N (e.g. 8.05/0.83=9.66).

The above results show that even when considering the worst case scenario, the electronic assembly will not be able to slide relative to the terminal. This is the desired result. In FIG. 7, "A" generally represents the relative wall length that creates an advantageous fulcrum point. This allows the designer to optimize the deflection and force applied to the electronic assembly 120. "B" generally represents the cantilever distance of the pin 116. Delta X (ΔX) generally refers to the vertical deflection that is experienced at a distal tip of the terminal 116 when the electronic assembly 120 is fully inserted. "F" generally represents the counter-force applied by the substrate/PCB 124 against the compression force from the terminal pins 116. Because the substrate/PCB 124 dissipates the force applied by the terminal pins 116, the sensing module 122 is not generally affected.

Figure 8:
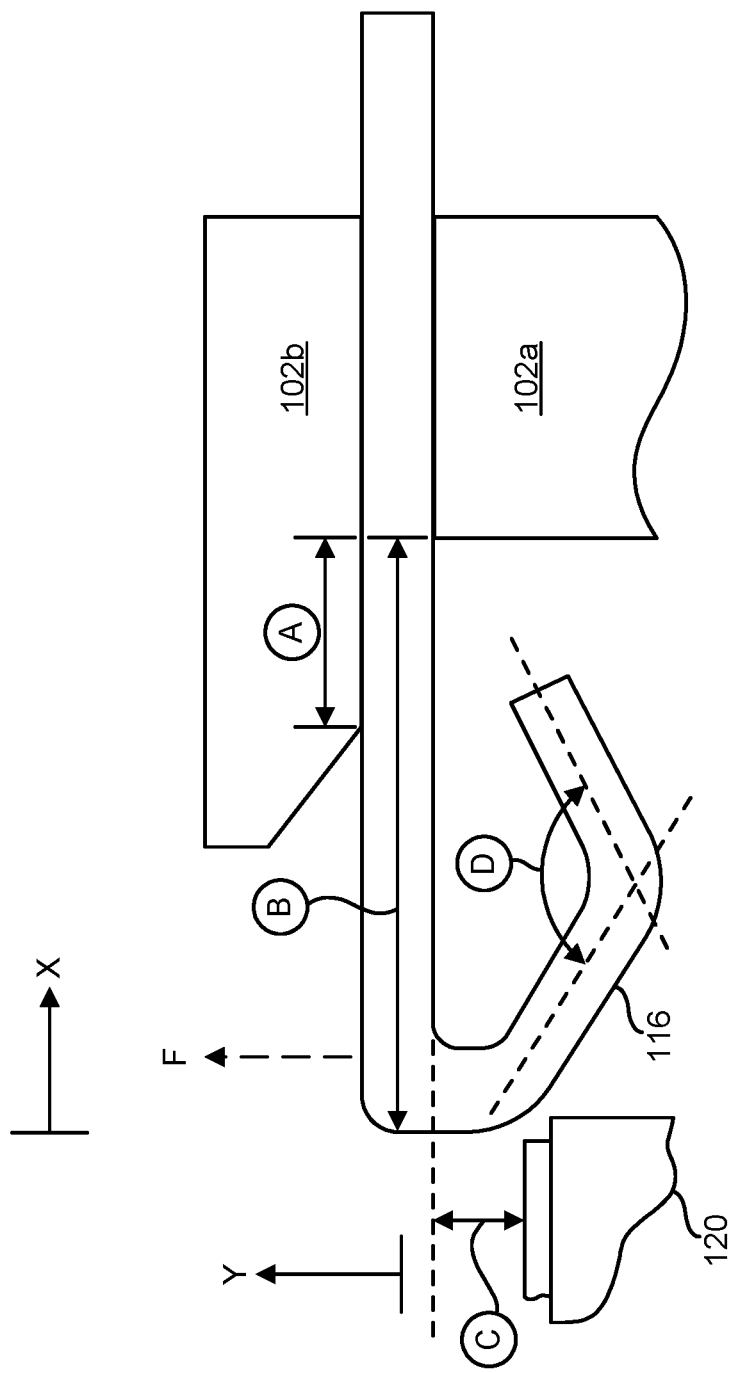
FIG. 8 is a diagram illustrating another example terminal design.

Referring to FIG. 8, a diagram is shown illustrating another example terminal design and variables utilized to optimize a pressure/deflection profile in accordance with an example embodiment of the invention. In another example, the end of pin 116 may be folded back on itself forming a spring portion that replaces the bead 118. The support offset A is added to the wall portion 102b. The portion of the pin 116 in the first cavity 104 includes the cantilever distance B. An initial height of the distal end of the pin 116 above the contact pad of the electronic assembly 120 is represented by C. The spring portion of the pin 116 includes an angle of incidence represented by D. The parameters as described above allow for the designer to optimize the force (F) vs deflection (C) (described below in connection with FIG. 9). This also allows for the designer to ensure that all materials are within the respective working limits throughout the lifetime of the product.

Figure 9:
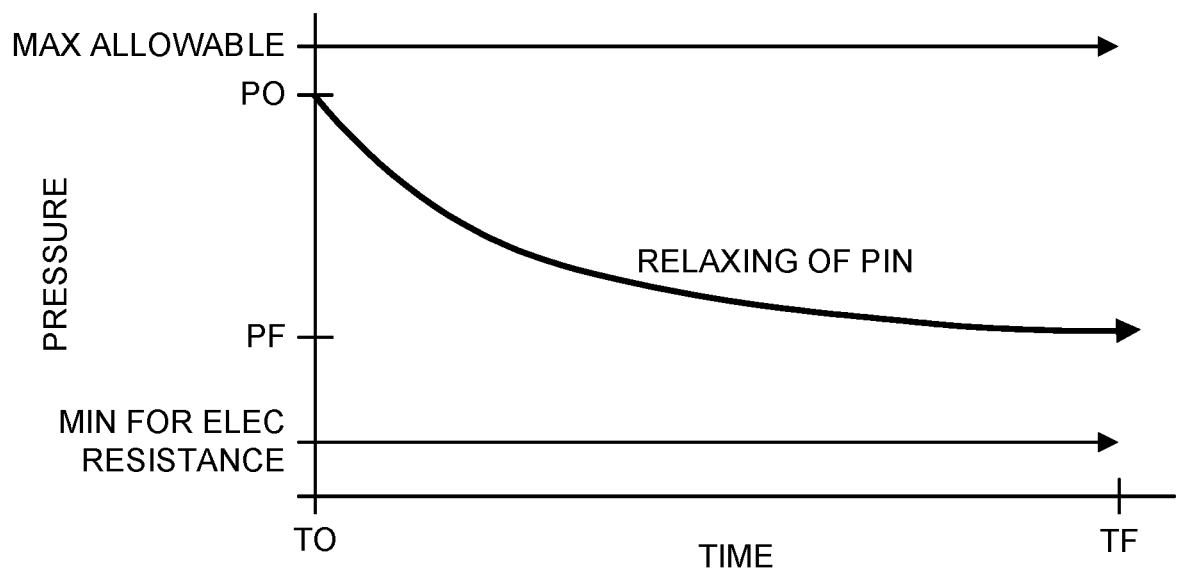
FIG. 9 is a diagram illustrating an example pressure profile of a terminal pin in accordance with an embodiment of the invention.

Referring to FIG. 9, a diagram is shown illustrating an example pressure profile of a terminal. In general, the pressure applied by the terminals 116 to the substrate/PCB 124 changes over a lifetime of the remote sensor assembly 100. The change occurs as the stress relaxes in the terminals 116. It is important that at the start of life (e.g., TO) the stress (e.g., PO) is not above the maximum allowable limit for the substrate and terminals. It is important also that at the end of life (e.g., TF) the pressure (e.g., PF) is not so low that the electrical contact resistance may be negatively affected or that the force may be too low as to allow the electronic assembly 120 to move (slide) in the sensor housing 102. In an example, the pressure at the end of life (e.g., PF) may be equivalent to the force determined to be needed to hold the electronic assembly in place during an impact.

Figure 10:
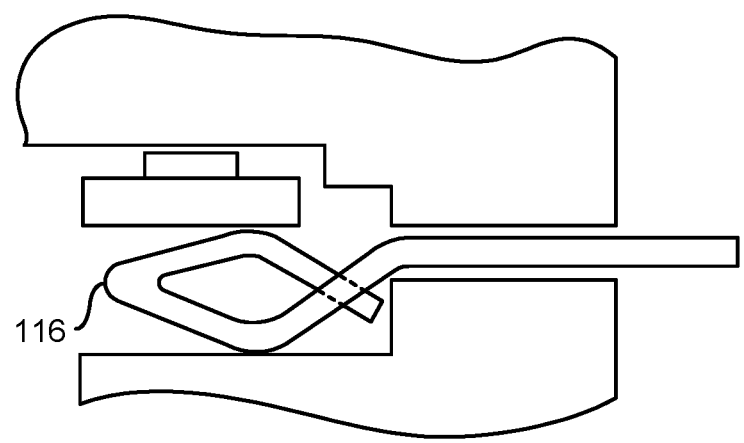
FIG. 10 is a diagram illustrating still another example terminal pin design in accordance with another example embodiment of the invention.
Figure 10:
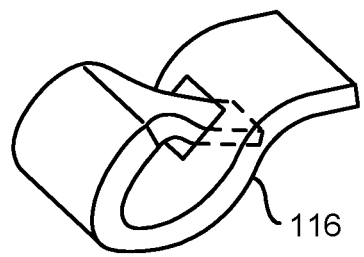

Referring to FIG. 10, a diagram is shown illustrating another example terminal design. In another example, the pins 116 may comprise a loop configured as a spring instead of having a cantilevered portion configured to deflect. In an example, the pin 116 may have a section folded back on itself and configured to flex (e.g., compress) when the electronic assembly is slid into position. In an example, an end of the pin 116 may be formed into a tenon configured to slide in and out of a mortise in a body of the pin 116. The mortise and tenon generally allow a distance between the two sides of the loop to compress as the electronic assembly is slid into position. The dimensions of the loop, the tenon and the mortise may be varied to configure the pin 116 to apply a desired normal force to the electrical contact pads of the electronic assembly substrate.

Figure 11:
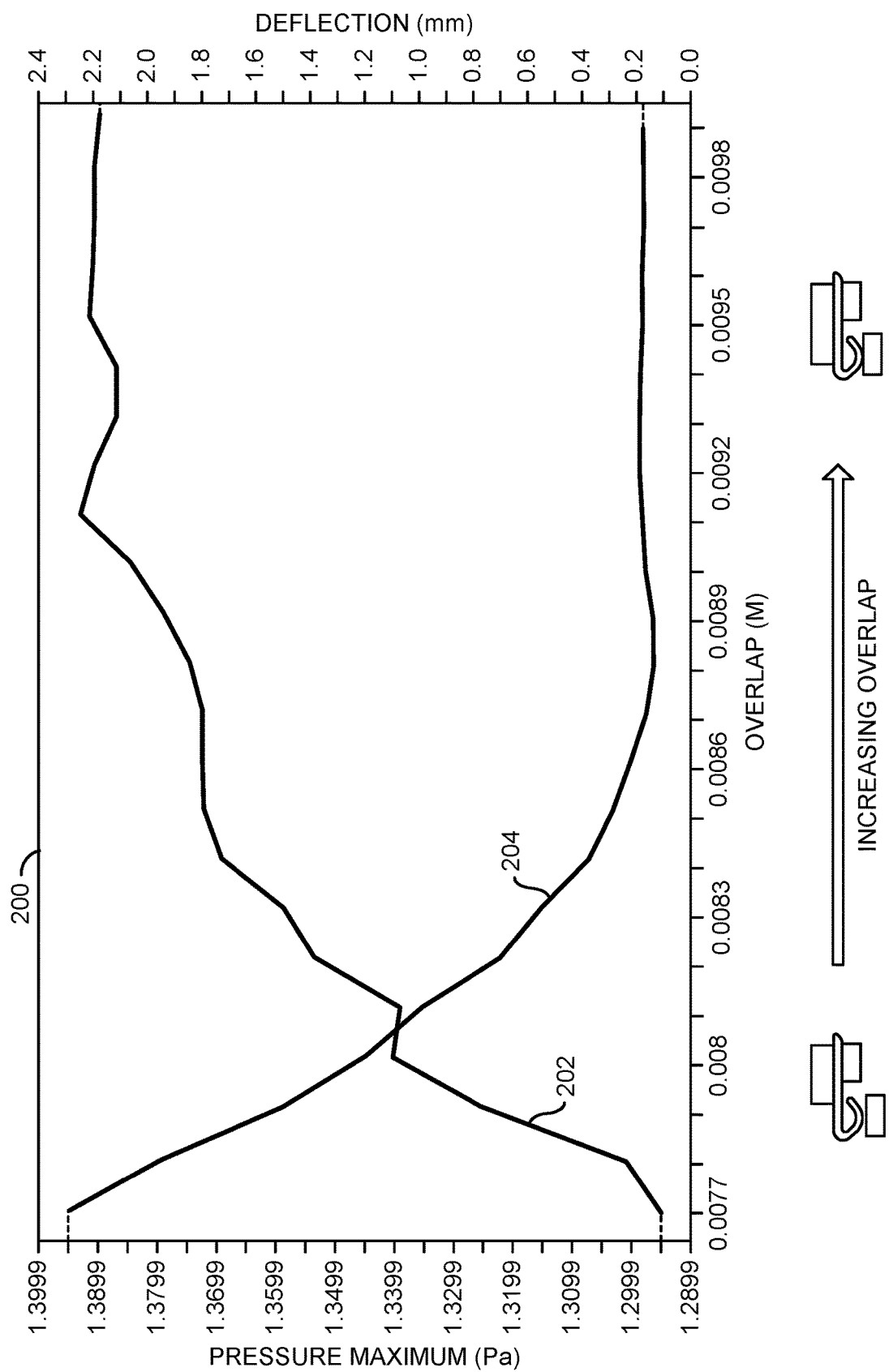
FIG. 11 is a diagram illustrating terminal deflection and pressure as functions of support offset.

Referring to FIG. 11, a diagram of a graph 200 is shown illustrating terminal deflection and pressure as functions of support offset (overlap). In an example, a curve 202 is shown illustrating pressure versus overlap. A curve 204 is shown illustrating deflection versus overlap. The two graphs generally illustrate that the pressure provided by the pins 116 and amount of deflection experienced by the pins 116 may be changed (adjusted) by changing (e.g., varying) the amount of overlap (e.g., A in FIGS. 7 and 8) in the portion 102b of the wall between the first cavity 104 and the second cavity 106 of the sensor housing 102.

The structures and parameters illustrated in the diagrams of FIGS. 1 to 11 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Data signals generated by the sensor units may be transferred to one or more electronic control units. The electronic control units may utilize the sensor data in one or more transport vehicle functions including, but not limited to, engine control, transmission control, braking control, battery management, steering control, door control, human machine interface, seat control, speed control, restraint systems control, vehicle-to-vehicle communications and diagnostics. The electronic control units may include capabilities to adjust the sensor data to account for calibration issues, environmental factors and aging components.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   an electronic assembly comprising a sensor module mounted on or encapsulated within a substrate comprising a plurality of exposed conductive pads; and
   a housing having a sensor cavity configured to receive the electronic assembly, a connector cavity configured to connect with a wire harness connector, a wall separating the sensor cavity and the connector cavity, and a plurality of terminals having a first end extending from the wall into the sensor cavity and a second end extending from the wall into the connector cavity, wherein the first end of each terminal is configured to form an electrical and mechanical connection with a respective conductive pad of the substrate, a first portion of the wall separating the sensor cavity and the connector cavity on a first side of the first end of each terminal nearest the electronic assembly has a first thickness, a second portion of the wall separating the sensor cavity and the connector cavity on a second side of the first end of each terminal opposite from the first side has a second thickness that is greater than the first thickness, the difference in thickness between the first portion and the second portion of the wall comprises an extension of the second portion of the wall into the sensor cavity, and the extension acts as a fulcrum configured to set an amount of deflection experienced by the first end of each terminal when the electronic assembly is inserted in the sensor cavity.

2. The apparatus according to claim 1, wherein the electrical and mechanical connections with the conductive pads are solderless connections.

3. The apparatus according claim 1, wherein the electrical and mechanical connections are maintained by a spring force of the terminals applied between the housing and the conductive pads.

4. The apparatus according claim 3, wherein the substrate is configured to prevent the spring force of the terminals from stressing the sensor module.

5. The apparatus according claim 1, wherein a first terminal is in electrical connection with a first conductive pad of the substrate to provide power to the sensor module.

6. The apparatus according claim 5, wherein a second terminal is in electrical connection with a second conductive pad of the substrate to provide a signal from the sensor module to a controller of a vehicle.

7. The apparatus according claim 5, wherein a second terminal is in electrical connection with a second conductive pad of the substrate to provide a circuit ground potential to the sensor module, and an accelerometer signal from the sensor module is modulated on the electrical connection with the first conductive pad.

8. The apparatus according claim 1, wherein the plurality of terminals are either stitched or molded in the housing.

9. The apparatus according claim 1, wherein the sensor module and the exposed conductive pads are either on the same side of the substrate or on opposite sides of the substrate.

10. The apparatus according claim 1, wherein the sensor module comprises at least one of a micro electro-mechanical system/sensor (MEMS), an accelerometer, a pressure sensor, or a temperature sensor.

11. The apparatus according claim 1, wherein the sensor module is part of a restraint control system of a vehicle.

12. A sensor housing assembly comprising:
a sensor cavity configured to receive an electronic assembly;
a connector cavity configured to connect with a wire harness connector;
a wall separating the sensor cavity and the connector cavity; and
a plurality of terminals having a first end extending from the wall into the sensor cavity and a second end extending from the wall into the connector cavity, wherein the first end of each terminal is configured to form an electrical and mechanical connection with a respective conductive pad on a surface of a substrate of said electronic assembly when inserted into said sensor cavity, a first portion of the wall separating the sensor cavity and the connector cavity on a side of the first end of each terminal nearest the electronic assembly has a first thickness, a second portion of the wall separating the sensor cavity and the connector cavity on a second side of the first end of each terminal opposite from the first side has a second thickness that is greater than the first thickness, the difference in thickness between the first portion and the second portion of the wall comprises an extension of the second portion of the wall into the sensor cavity, and the extension acts as a fulcrum configured to set an amount of deflection experienced by the first end of each terminal when the electronic assembly is installed in the sensor housing.

13. The sensor housing assembly according claim 12, wherein the plurality of terminals are either stitched or molded in the housing.

14. The sensor housing assembly according to claim 12, wherein the electrical and mechanical connections with the conductive pads are solderless connections.

15. The sensor housing assembly according claim 12, wherein the electrical and mechanical connections are maintained by a spring force of the terminals applied between the housing and the conductive pads.

16. The sensor housing assembly according claim 15, wherein the substrate is configured to prevent the spring force of the terminals from stressing the electronic assembly.

17. The sensor housing assembly according claim 12, wherein the sensor cavity comprises features configured to allow the electronic assembly to be slid into the sensor cavity and located relative to the terminals.

18. The sensor housing assembly according claim 17, wherein the features comprise ribs configured to contact opposite surfaces of the substrate in order to align and hold the electronic assembly in position against the terminals.

19. The sensor housing assembly according claim 12, wherein the electronic assembly comprises a kinematic sensor.

20. The sensor housing assembly according claim 19, wherein the electronic assembly comprises at least one of a micro electro-mechanical system/sensor (MEMS), an accelerometer, a pressure sensor, or a temperature sensor.

* * * * *